(12) United States Patent
Yamada

(10) Patent No.: US 6,686,215 B2
(45) Date of Patent: Feb. 3, 2004

(54) METHOD OF PRODUCING AN ELECTROLUMINESCENCE DISPLAY DEVICE

(75) Inventor: Tsutomu Yamada, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/820,139

(22) Filed: Mar. 28, 2001

(65) Prior Publication Data

US 2001/0055844 A1 Dec. 27, 2001

(30) Foreign Application Priority Data

Mar. 31, 2000 (JP) ........................................ 2000-096094

(51) Int. Cl.[7] .............................................. H01L 21/00
(52) U.S. Cl. ........................................................ 438/22
(58) Field of Search ................................ 438/22, 28, 29, 438/42

(56) References Cited

U.S. PATENT DOCUMENTS 5,937,272 A   8/1999   Tang ............................ 438/30
6,087,772 A * 7/2000   Ootsuki et al. ............. 313/505
6,255,775 B1 * 7/2001   Ikuko et al. ................. 313/506

OTHER PUBLICATIONS

Office Action from Taiwan Patent Application Ser. No. 090107326.

* cited by examiner

Primary Examiner—David Nelms
Assistant Examiner—Quoc Hoang
(74) Attorney, Agent, or Firm—Cantor Colburn LLP

(57) ABSTRACT

An emissive element layer (65) composed of an organic compound is formed on an anode (61) of an organic EL element or the like, using an evaporation mask (150) in which the width d of an opening (151) and the thickness h of the mask (150) satisfy the relationship h>n×d, Where n>1, and more preferably $1<n\leq2.5$. Accordingly, an EL display device can be obtained in which outspread of an emissive layer material onto an adjacent pixel electrode can be prevented to thereby reduce color mixture.

5 Claims, 7 Drawing Sheets

METHOD OF PRODUCING AN ELECTROLUMINESCENCE DISPLAY DEVICE

BACKGROUND OF THE INVENTION

1. Field of the Invention

The present invention relates to a method of producing an electroluminescence (hereinafter referred to as "EL") display device.

2. Description of Related Art

EL display devices using an EL element have recently attracted interest as potential replacements for devices such as CRT or LCD displays.

Also, EL display devices having a thin film transistor (TFT) as a switching element for driving the EL element have been studied and developed.

FIG. 1 shows, in a plan view, one display pixel of an organic EL display device. FIG. 2 is an equivalent circuit diagram corresponding to one display pixel of an EL display device.

Referring to FIGS. 1 and 2, a display pixel is formed in a region enclosed by a gate signal line 51 and a drain signal line 52. Around the intersection of both signal lines is formed a first TFT 30 as a switching TFT. A source 31s of the first TFT 30 also functions as a storage capacitor electrode 55, and a storage capacitor 70 is formed between the source 31s and a storage capacitor electrode 54 which will be described later. The source 13s of the TFT 30 is also connected to a gate 41 of a second TFT 40 which drives an organic EL element. A source 43s of the second TFT 40 is connected to an anode 61 of the organic EL element while a drain 43d is connected to a power source line 53 for driving the organic EL element.

The storage capacitor electrode 54 is disposed in parallel to the gate signal line 51 so as to run through each pixel. The storage capacitor electrode 54 is composed of chromium or the like, and charges are accumulated between the storage capacitor electrode 54 and the capacitor electrode 55, which also functions as the source 31s of the first TFT 30, via a gate insulating film 12. The storage capacitor 70 is provided so as to hold a voltage to be applied to the gate 41 of the second TFT 40.

On a substrate composed of a glass or the like are formed the above-mentioned first and second TFTs 30, 40, the lines 51, 52, 53 for supplying a gate signal, a data signal, and an element driving power to these TFTs, and the above-referenced storage capacitor electrode 54. A planarizing insulating film 17 is further formed so as to cover these elements. Over the planarizing insulating film 17, a transparent electrode using ITO (Indium Tin Oxide), specifically, an anode 61 of an organic EL element 60, is disposed.

The organic EL element 60 comprises the anode 61, an emissive element layer comprising an organic compound and formed on the anode 61, and a cathode formed on the emissive element layer as a common layer for each element. The emissive element layer comprises at least an emissive layer, and may have a laminated structure including, for example, a hole transport layer, an emissive layer, and an electron transport layer, which are disposed in that order from the anode side.

In the organic EL element configured as described above, holes injected from the anode and electrons injected from the cathode are recombined inside the emissive layer to excite organic molecules forming the emissive layer for causing exciton. In the process of radiation and deactivation by the exciton, the emissive layer produces light which is emitted from the transparent anode through the transparent insulating substrate.

Next, a method of forming an emissive element layer of the above-described organic EL element will be described.

For a color display device, in order to emit red (R), green (G), and blue (B) light, it is necessary that the emissive layers for emitting these colors are formed from different materials associated with colors to be emitted. The emissive material layers are formed on the hole transport layer by means of evaporation. More specifically, an emissive material of each of different colors including, for example, red, green, and blue is sequentially evaporated on the corresponding anode 61 in an island pattern corresponding to the anode 61.

Thus, the emissive layer for emitting each color of R, G, or B is sequentially formed corresponding to the anode 61 for each pixel electrode in a repeated manner, so that, when observed in a plan view, the emissive layers are arranged within the display area of the substrate in a matrix pattern.

When forming the emissive layers, a metal mask 250 having openings at locations corresponding to the display pixels for emitting light of the same color, as shown in FIG. 3, is moved in the right or left direction in FIG. 3, so that an emissive layer material for each color is evaporated.

FIG. 3 shows a case of evaporating an emissive material of B, with the emissive layers of R and G already formed. Namely, an emissive material of blue, which is placed on an evaporation source 200, is evaporated and accumulated at locations corresponding to the display electrodes for the B color.

However, the metal mask 250 for use in evaporation as shown in FIG. 3, which has openings 251 at locations corresponding to the emissive layers of the same color, causes problems such as the following. When the thickness of the metal mask is h, and the width of the opening (the horizontal direction in FIG. 3) is d, and the width d is too large with regard to the thickness h, the emissive material evaporated from the evaporation source is deposited not only on the intended display pixel, but spreads to areas of the emissive layer of an adjoining pixel electrode designed to emit a different color. For example, on a pixel electrode in which the emissive material of G is already evaporated and accumulated, emissive material for B color for the adjacent pixel can be mixed such that a mixed color of B and G is generated. This leads to a disadvantage that intended color display can not be obtained.

SUMMARY OF THE INVENTION

The present invention was conceived in view of the aforementioned problems of the related art and aims to provide a method of producing an EL display device in which spread of an emissive layer material onto an adjoining pixel electrode is prevented, thereby reducing color mixture and enabling more accurate and consistent display of desired colors.

In accordance with the present invention, there is provided a method of producing an electroluminescence display device comprising an emissive layer for emitting a color formed between an anode and a cathode constituting a pixel electrode, in which provided on said anode to form said emissive layer is a mask having a thickness h and an opening width d determined between adjacent display pixels such that the thickness h and the opening width d satisfying the relationship $h > n \times d$, wherein $n > 1$.

Further, in the above method, it may be preferable that the thickness h and the opening width d of the mask satisfy a relation of h>n×d where $1 < n \leq 2.5$.

Further, in the above method, said mask may be formed from a metal or semiconductor.

As described above, in accordance with the present invention, the emissive layer is formed using a mask having an appropriate thickness with respect to the width of the opening, so that mixture of colors between emissive layers in adjoining pixel electrodes can be reduced. It is therefore possible to provide an EL display device capable of displaying pure colors.

BRIEF DESCRIPTION OF THE DRAWINGS

These and other objects of the invention will be explained in the description below, in connection with the accompanying drawings, in which.

DETAILED DESCRIPTION OF THE PREFERRED EMBODIMENT

A preferred embodiment of the present invention will be described in further detail with reference to the accompanying drawings.

A method of producing an EL display device according to the present invention will be described.

Figure 4:
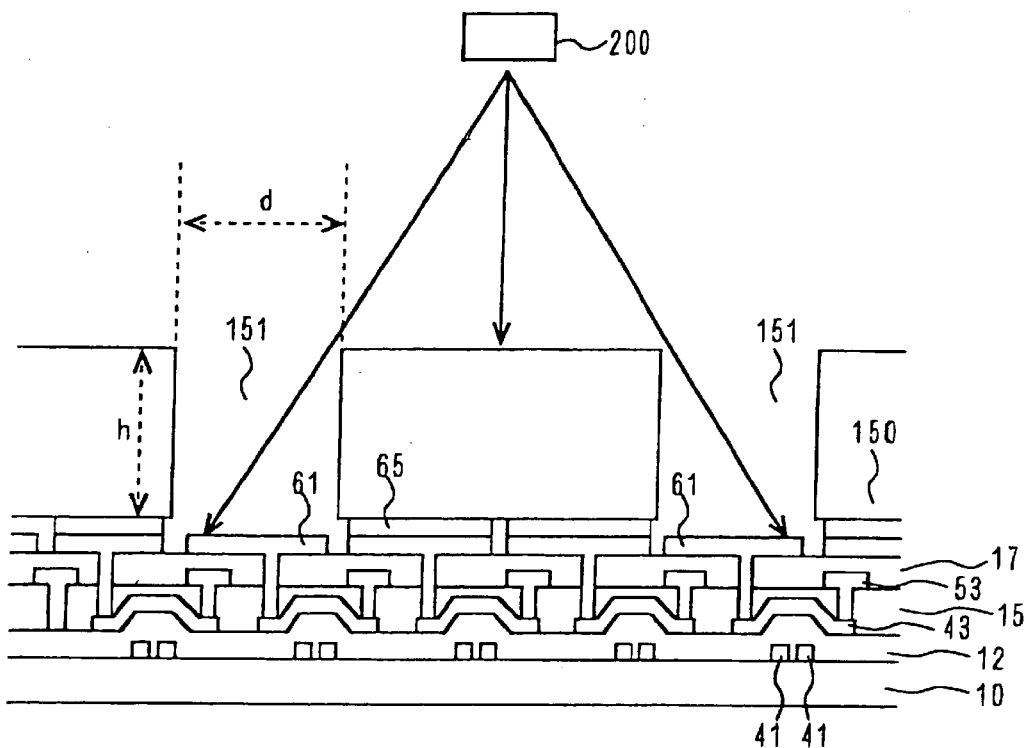
FIG. 4 is a view explaining a process for evaporating and forming an emissive element layer of an EL display device according to the present invention.
Figure 5:
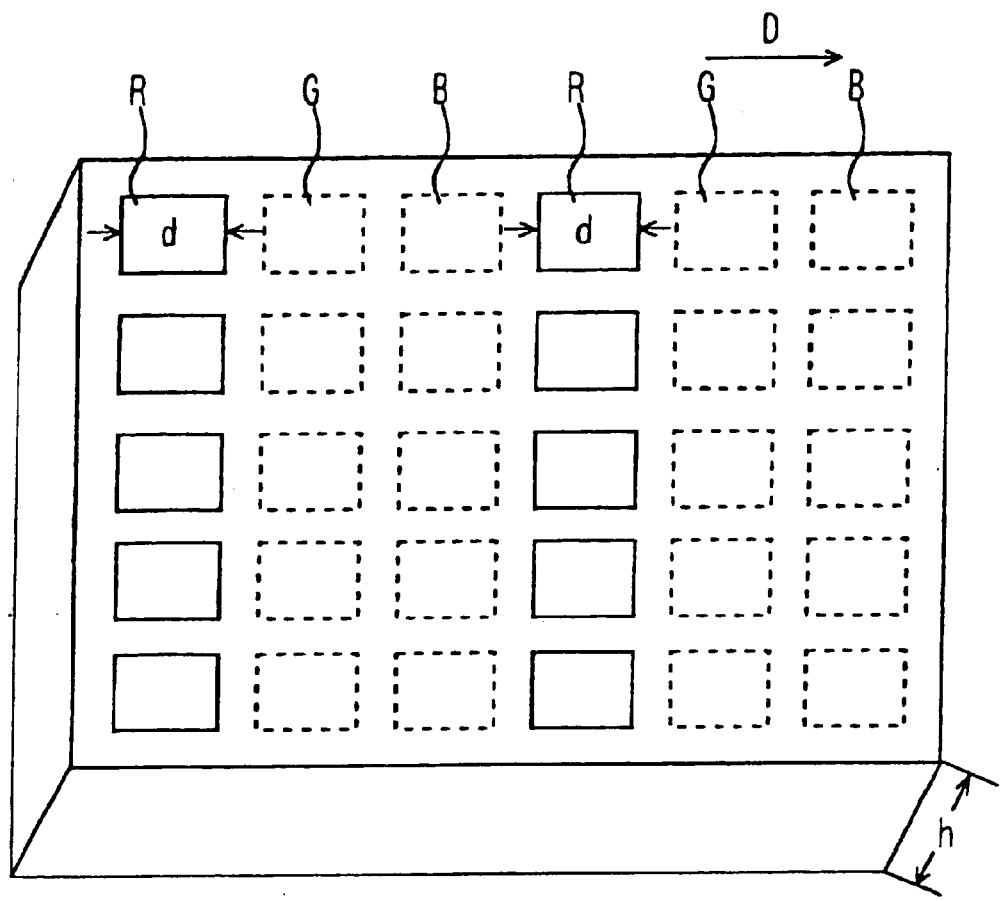
FIG. 5 is a perspective view of a mask used for forming an emissive layer of the EL display device according to the present invention.

FIG. 4 shows, in a cross sectional view, a process for evaporating an emissive material of an EL display device of the present invention. FIG. 5 is a perspective view of a mask used for forming an emissive layer of the EL display device of the present invention. According to the present invention, a mask having a sufficient thickness with respect to the width of an opening of the mask, as will be described later, is used to form an emissive element layer of an organic EL element by evaporation.

The structure in plane of each pixel electrode and the equivalent circuit of the EL display device are similar to those described with reference to FIGS. 1 and 2.

The structures of the first and second TFTs 30, 40 for controlling the organic EL element will be first described with reference to FIG. 6A, which is a cross sectional view taken along line A—A of FIG. 1, and FIG. 6B, which is a cross sectional view taken along line B—B of FIG. 1.

First, the first TFT 30, which is a switching TFT, will be described with reference to FIG. 6A.

Figure 6A:
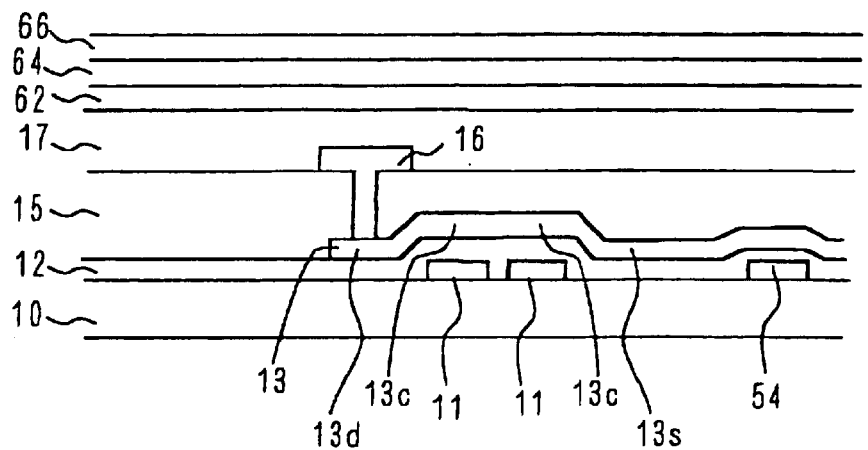
FIGS. 6A and 6B are cross sectional views of an organic EL display device.

As shown in FIG. 6A, on an insulating substrate 10 composed of a quartz glass, a nonalkaline glass, or the like, are formed a gate signal line 51 including gate electrodes 11 and comprising a refractory metal such as chromium (Cr), molybdenum (Mo), or the like, and a storage capacitor electrode line 54.

Over these layers is formed a gate insulating film 12, and an active layer 13 formed from a poly-Silicon film (hereinafter referred to as a "p-Si film") is further disposed thereon. The active layer 13 has a so-called LDD (Lightly Doped Drain) structure. Specifically, low density regions 13LD are provided at each side of the respective gates 11, and a source 13s and a drain 13d which are high density regions are further provided outside of the low density regions.

Further, over the entire surface covering the gate insulating film 12 and the active layer 13, an interlayer insulating film 15 is formed by sequentially laminating an $SiO_2$ film, an SiN film, and an $SiO_2$ film, and a metal such as Al or the like is used to fill a contact hole formed in the position in the interlayer insulating film 15 corresponding to the drain 13d to thereby form a drain electrode 16 also functioning as a drain signal line 52. Then, a planarization insulating layer 17 composed of-an organic resin is further provided over the entire surface for surface planarization. When organic layers (62, 64) and the planarization insulating layer 17 are all formed from the same material used for each organic EL element 60, the organic layers (62, 64) are formed on top of the planarization insulating layer 17, where in all cases a cathode 66 is further provided.

Next, the second TFT 40, which is a driving TFT for supplying an electric current to the organic EL element, will be described.

Figure 6B:
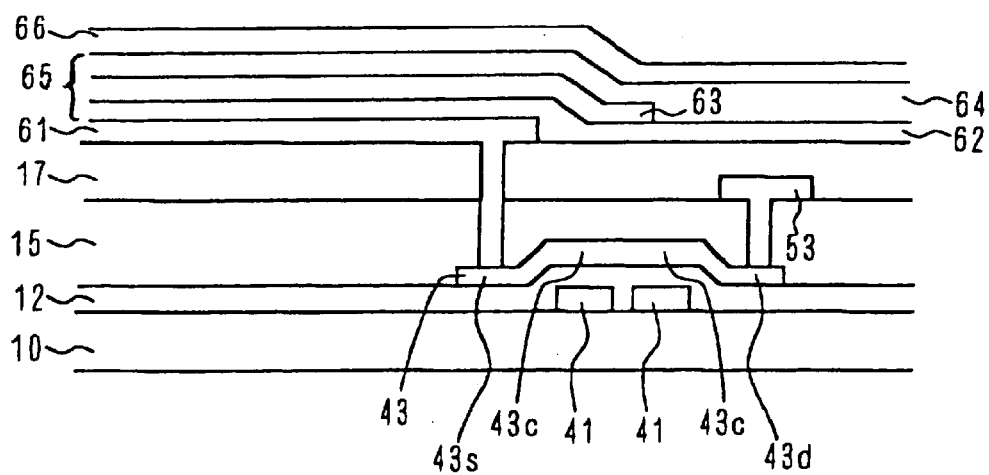

Referring to FIG. 6B, on the insulating substrate 10 formed from a quartz glass, a nonalkaline glass, or the like, gate electrodes 41 each comprising a refractory metal such as Cr, Mo, or the like are formed, and the gate insulating film 12 and an active layer 43 formed from a p-Si film are sequentially formed thereon. In the active layer 43, channels 43c which are intrinsic or substantially intrinsic are formed at positions above the respective gate electrodes 41. Regions at each side of the channel pair are a source 43s and a drain 43d, respectively, formed by doping with p-type impurities.

The interlayer insulating film 15 is formed by sequentially laminating an $SiO_2$ film, an SiN film, and an $SiO_2$ film over the entire surface on the gate insulating film 12 and the active layer 43. A contact hole in the interlayer insulating film 15 formed so as to correspond to the drain 43d is filled with a metal such as Al to form the power source line 53 connected to the power source 50, so that the power source line 53 is connected with the drain 43d. Further, the planarization insulating film 17 formed from an organic resin is provided over the entire surface to planarize the surface. A contact hole is formed through the planarization insulating film 17 and the interlayer insulating film 15 at a position corresponding to the source 43s. On the planarization insulating film 17 is provided a transparent electrode, specifically, the anode 61 of the organic EL element, which comprises ITO (Indium Tin Oxide). The anode 61 makes contact with the source 43s via the contact hole.

The organic EL element 60 comprises the anode 61 formed from a transparent electrode such as ITO or the like, the emissive element layer 65, and the cathode 66 sequentially formed in that order. The emissive element layer 65 further comprises a hole transport layer 62 formed from a first hole-transport layer and a second hole-transport layer, the emissive layer 63, and an electron-transport layer 64 formed from the anode side in that order. The first hole-transport layer comprises MTDATA (4,4',4"-tris(3-methylphenylphenylamino)triphenylamine) and the second hole-transport layer comprises TPD (N,N'-diphenyl-N,N'-di (3-methylphenyl)-1,1'-biphenyl-4,4'-diamine), the emissive layer 63 comprises Bebq$_2$ (bis(10-hydroxybenzo[h] quinolinato)berylliuim) including quinacridone derivative, and the electron-transport layer 64 comprises Bebq$_2$. The cathode 66 is formed over the entire surface of the substrate 10 on which the organic EL display device shown in FIG. 1 is formed, in other words, over the entire surface shown in FIG. 1.

In the organic EL element 60 thus configured, holes injected from the anode and electrons injected from the cathode are recombined inside the emissive layer to excite organic molecules therein, thereby causing exciton. In the process of radiation and deactivation by the exciton, the emissive layer produces light which is emitted from the transparent anode through the transparent insulating substrate.

A method of forming the above-described emissive element layer 65 disposed on the anode 61 will be next described.

FIG. 4 is a cross sectional view for explaining a process for forming an emissive element layer 65, which emits blue (B) light, on the anode 61 disposed on the planarization insulating film 17 which is formed on the TFT on the insulating substrate 10 as described above. In this case, emissive element layers which respectively emit red (R) and green (G) light have already been formed.

On the substrate 10, on which various layers to the anode are already formed, a metal mask 150 which is composed of tungsten (W), silicon (Si), or the like, and which has openings 151 at regions corresponding to the emissive element layers of B to be formed, is disposed as to cover the emissive element layers 65 which are already formed.

Then, an emissive material for emitting color B is placed on the evaporation source 200 and evaporated. This material accumulates below the openings 151 of the metal mask, areas which correspond to the respective B color pixel electrodes.

In this manner, the metal mask is moved in one direction so that an emissive material for each of RGB colors is sequentially evaporated and accumulated. Although the mask 150 and the evaporation source 200 are provided above the substrate in FIG. 4, the mask 150 and the evaporation source 200 may be provided under the substrate which is disposed with the evaporation surface located at the bottom. In either case, the relative positional relationship between the evaporation surface of the substrate, and the mask and the evaporation source, is the same.

As shown in FIG. 5, in the mask used for producing the EL display device according to the present invention, the thickness h is sufficiently larger than the opening width d, where d is the width of an opening 151 of the mask, which corresponds to a display pixel, in the moving direction (arrow D), namely the width in the horizontal direction in FIG. 4, and h is the thickness of the mask.

Specifically, the dimension of the mask is determined such that the opening width d of the mask and the thickness h of the mask satisfy the relationship h>n×d (n>1).

The relationship between the opening width d and the thickness h of an evaporation mask will be described with reference to FIG. 7.

Figure 7:
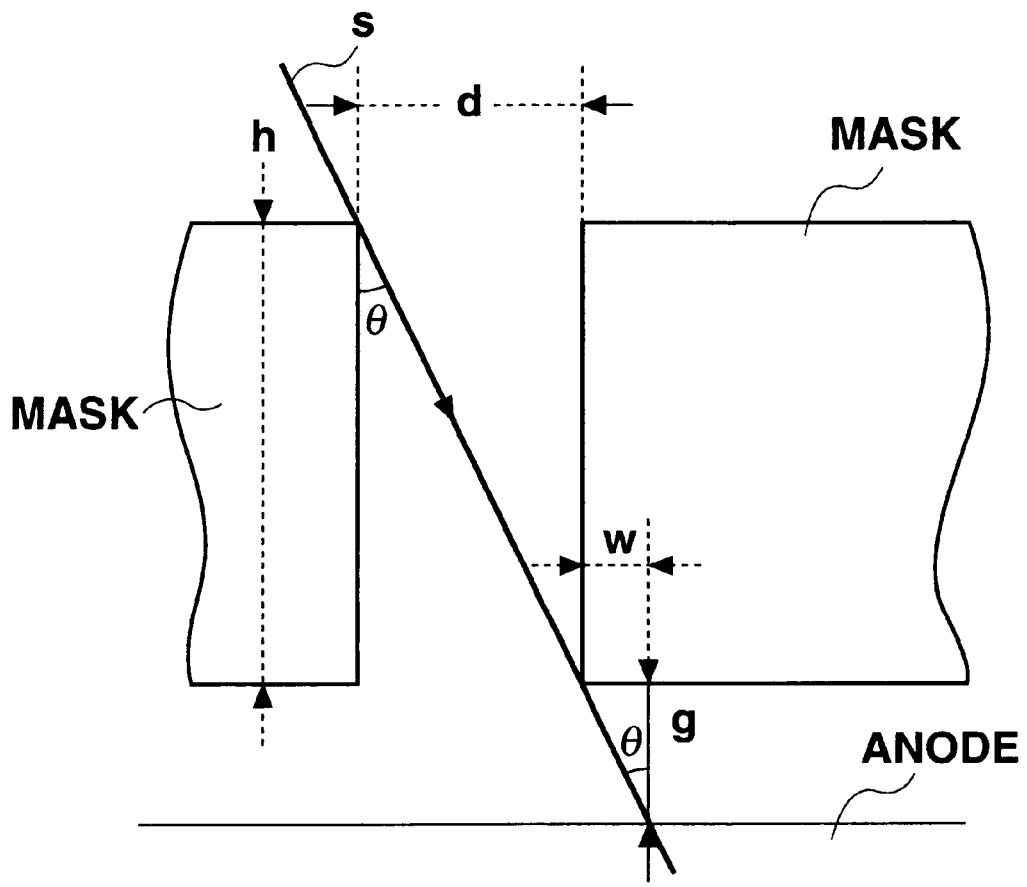
FIG. 7 is a expanded sectional view showing the vicinity of an opening of an evaporation mask.

FIG. 7 shows a relationship between the opening width d and the thickness h of an evaporation mask.

When, for example, the opening width d of an evaporation mask is 50 μm and the thickness h of the mask is 125 μm, the relationship h=2.5×d is satisfied. When a gap between the anode and the evaporation mask is g and the outspread distance due to evaporation is w, and when the gap g is large, the accuracy of evaporation position is lowered and the evaporation mask warps significantly. When the gap is 0, the mask is in contact with the substrate (the anode surface), and the sample will be damaged. Therefore, the gap is set to 20 μm in this example.

Under these conditions, an organic material supplied from the evaporation source moves in the direction of arrow s (from upper left to lower right in the figure) to be disposed on the anode. At this point, the angle formed by the direction perpendicular to the evaporation mask (the vertical direction in FIG. 7) and the moving direction s of the organic material is θ≈22°, and the outspread distance w is approximately 8 μm.

In addition, a deviation caused by the evaporation mask alignment is approximately 10 μm. By combining this deviation with the outspread distance w of 8 μm, the total deviation of the mask results in approximately 20 μm.

Figure 1:
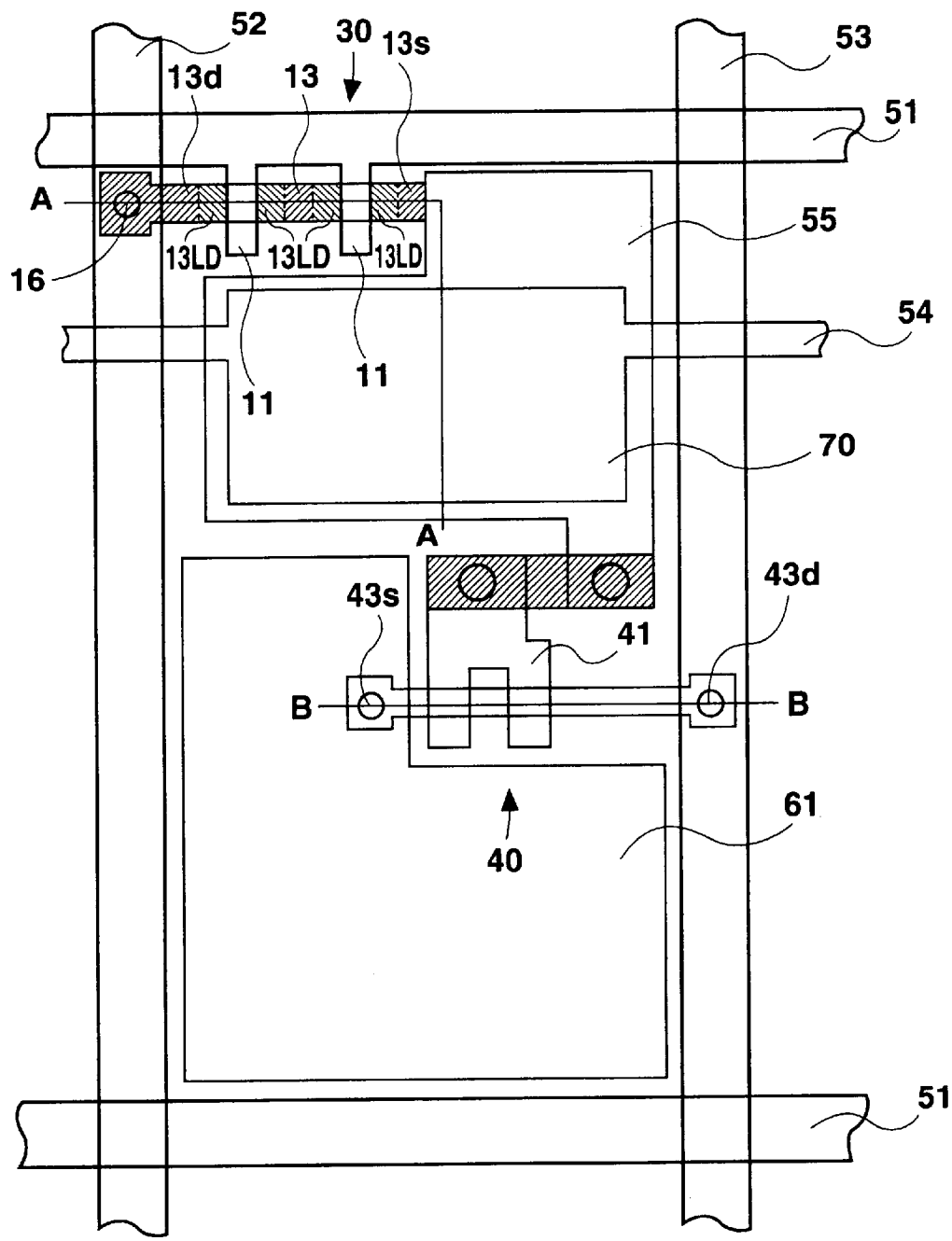
FIG. 1 is a plan view of an EL display device corresponding to one display pixel.
Figure 2:
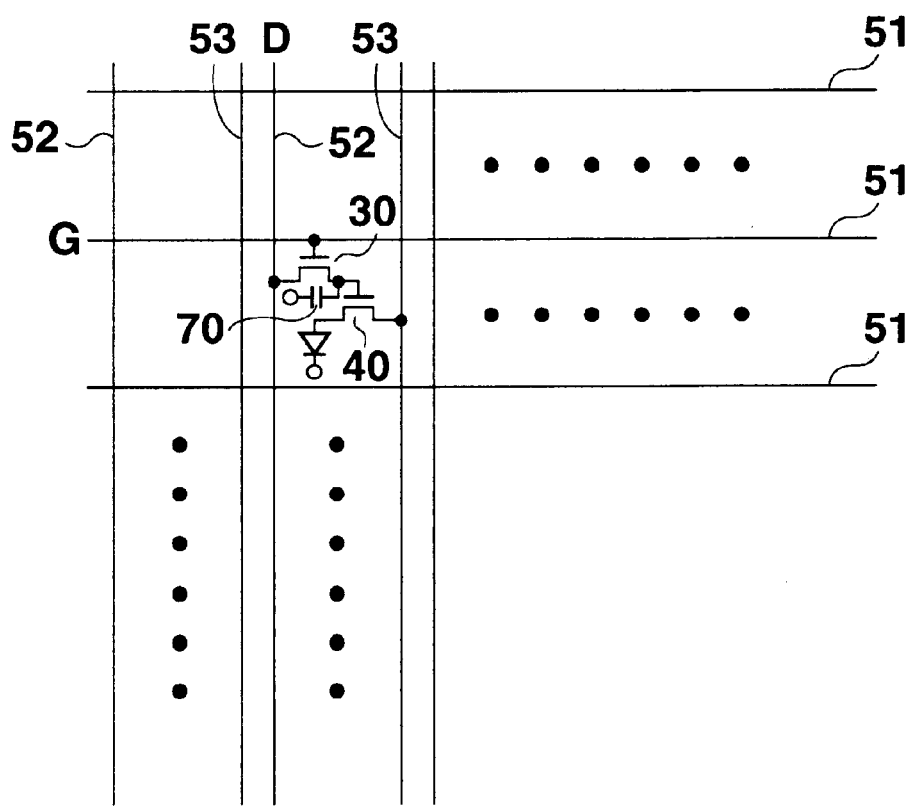
FIG. 2 is an equivalent circuit diagram corresponding to one display pixel of an EL display device.
Figure 3:
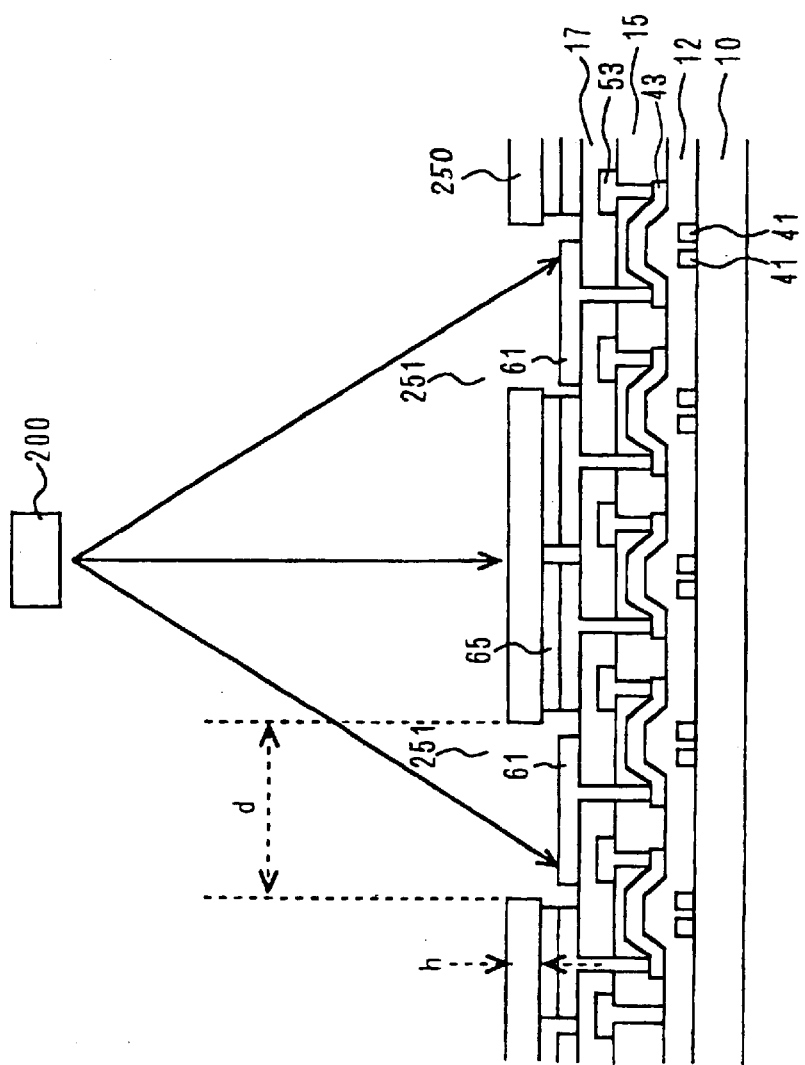
FIG. 3 is a view explaining a process for evaporating and forming an emissive element layer of an EL display device according to a related art.

In the organic EL display device in which a plurality of display electrodes, one of which is shown in FIG. 1, are arranged in a matrix pattern, the adjoining anodes 61 are separated with each other by a total gap of approximately 20 μm including the width of the driving power source line 53 of approximately 6 μm, the width of the drain signal line of approximately 6 μm, and a gap therebetween of 6–8 μm.

Accordingly, unless n≦2.5 is satisfied in the relation of h>n×d between the thickness h of the mask and the opening depth d, the organic material will deposit on an anode of an adjacent pixel electrode for emitting a different color. When this occurs, colors are mixed and the intended color of light will not be emitted.

Further, when the evaporation mask is thin, namely when the thickness h of the evaporation mask is reduced, the strength of the mask itself will be lowered. In particular, when four sides of a rectangular mask are pulled when mask alignment is performed so that the mask will not loosen, the mask may be damaged by the pulling force. It is therefore preferable that the ratio of the thickness h of the mask to the opening width d be 1 or more.

Also, as can be seen from FIG. 4, when the gap between the evaporation source 200 and the substrate is wider, a larger evaporation device will be necessary, and, therefore, the gap between the evaporation source and the substrate will be restricted by the capacity of the evaporation device. Accordingly, in an example wherein a substrate having a dimension of 10 cm×10 cm~40 cm×40 cm is disposed with regard to the deposition source by a gap of 50 cm, and when the width d is set to 50 μm, the thickness h of the mask may be 50 μm to 250 μm. In other words, in the expression of h>n×d which represents a relation between the thickness h and the opening width d, n may be 1<n≦2.5.

As described above, as long as the opening width d and the thickness h of the mask satisfy the relationship h>n×d (n>1), it is possible to eliminate outspread of an emissive material for an associated emissive layer onto the emissive layer of the adjoining pixel electrode, thereby preventing color mixture. As a result, an EL display device capable of displaying pure colors can be manufactured.

On the emissive layer 63 thus formed, the electron transport layer 64 and the cathode 66 are sequentially formed to complete the organic EL display element 60. The cathode 66 is formed over the entire surface of the substrate 10 on which the organic EL display device is formed, in other words, over the entire surface of the sheet.

As described above, by providing a mask for evaporating a material of an emissive layer of an EL display device such that the opening width d of the mask and the thickness h of the mask satisfy the relationship h>n×d, where n is a positive number, it is possible to prevent an emissive layer material from being spread over the bottom surface of the mask such that it mixes with an emissive layer material of the adjoining display pixel. As a result, the problem that emission colors are mixed to create a color other than the intended display color can be reduced or eliminated such that pure colors can be displayed.

While the preferred embodiment of the present invention has been described using specific terms, such description is for illustrative purposes only, and it is to be understood that changes and variations may be made without departing from the spirit or scope of the appended claims.

What is claimed is:

1. A method of producing an electroluminescence display device having one or more display pixels, each of said display pixels comprising an emissive layer for emitting light formed between a first electrode and a second electrode, in which provided above said first electrode is a mask to form said emissive layer, said mask having a thickness h and an opening width d of said mask in a region corresponding to said display pixel which satisfy the relationship h >n×d, wherein n>1, and a gap between said mask and a surface onto which said emissive layer is formed is 20 $\mu$m or less.

2. A method of producing an electroluminescence display device according to claim 1, wherein the thickness h and the opening width d of the mask satisfy of the relationship h>n×d, where 1<n≦2.5.

3. A method of producing an electroluminescence display device according to claim 1, wherein said mask is formed from a metal or semiconductor.

4. A method of producing an electroluminescence display device according to claim 2, wherein said mask is formed from a metal or semiconductor.

5. A method of producing an electroluminescence display device according to claim 1, wherein the gap is greater than 0.

* * * * *